US012768031B2

(12) United States Patent
Kölker et al.

(10) Patent No.: US 12,768,031 B2
(45) Date of Patent: Oct. 20, 2026

(54) METHOD AND DEVICE FOR APPLYING A COATING

(71) Applicant: CemeCon AG, Würselen (DE)

(72) Inventors: Werner Kölker, Herzogenrath (DE); Stephan Bolz, Aachen (DE); Oliver Lemmer, Aachen (DE)

(73) Assignee: CemeCon AG, Würselen (DE)

( * ) Notice: Subject to any disclaimer, the term of this patent is extended or adjusted under 35 U.S.C. 154(b) by 485 days.

(21) Appl. No.: 18/000,561

(22) PCT Filed: Jun. 17, 2021

(86) PCT No.: PCT/EP2021/066499
§ 371 (c)(1),
(2) Date: Dec. 2, 2022

(87) PCT Pub. No.: WO2021/255201
PCT Pub. Date: Dec. 23, 2021

(65) Prior Publication Data

US 2023/0220540 A1 Jul. 13, 2023

(30) Foreign Application Priority Data

Jun. 18, 2020 (DE) ..................... 10 2020 116 157.3

(51) Int. Cl.
*C23C 14/34* (2006.01)
*C23C 14/54* (2006.01)

(52) U.S. Cl.
CPC ........ *C23C 14/3485* (2013.01); *C23C 14/542* (2013.01)

(58) Field of Classification Search
CPC .............. C23C 14/3485; C23C 14/542; C23C 14/0641; C23C 14/3492; C23C 14/35;
(Continued)

(56) References Cited

U.S. PATENT DOCUMENTS

2007/0092761 A1 4/2007 Ohata
2008/0135401 A1 6/2008 Kadlec et al.
(Continued)

FOREIGN PATENT DOCUMENTS

CN 101838795 A 9/2010
EP 2784799 A1 * 10/2014 ......... C23C 14/0641
(Continued)

OTHER PUBLICATIONS

Cemin, F. et al. "Tuning high power impulse magnetron sputtering discharge and substrate bias conditions to reduce the intrinsic stress of TiN thin films," Thin Solid Films, Elsevier, Amsterdam, NL, vol. 688, May 30, 2019.
(Continued)

*Primary Examiner* — Patrick S Ott
(74) *Attorney, Agent, or Firm* — Christensen O'Connor Johnson Kindness PLLC

(57) ABSTRACT

The invention relates to a method and a device to for applying a layer 64 to a body 60, 62, and to a coated body 60. The body 60, 62 is disposed in a vacuum chamber 12 and process gas is supplied. A plasma is generated in the vacuum chamber 12 by operating a cathode 30 by applying a cathode voltage $V_P$ with cathode pulses and by sputtering a target 32. A bias voltage $V_B$ is applied to the body 60, 62 so that charge carriers of the plasma are accelerated into the direction of the body 60, 62 and attached to its surface. In order to achieve favorable properties of the coating 64 in a controlled way, the time course of the bias voltage $V_B$ is varied during the coating duration D. In the coating 64 of the body 60, 62, the material of the layer 64 comprises proportions of a noble gas, the concentration of which in the layer 64 varies over the layer thickness.

14 Claims, 8 Drawing Sheets

(58) Field of Classification Search
CPC .............. C23C 14/345; H01J 37/32706; H01J 37/3405; H01J 37/3417; H01J 37/3438; H01J 37/3444; H01J 37/3467; H01J 37/3473
See application file for complete search history.

(56) References Cited

U.S. PATENT DOCUMENTS

| | | | | |
|---|---|---|---|---|
| 2014/0305792 | A1* | 10/2014 | Krassnitzer | H01J 37/3467 204/192.12 |
| 2015/0259782 | A1* | 9/2015 | Rachbauer | C23C 14/0617 427/255.15 |
| 2015/0275120 | A1 | 10/2015 | Lehnert et al. | |

FOREIGN PATENT DOCUMENTS

| | | | |
|---|---|---|---|
| EP | 3 457 428 | A1 | 3/2019 |
| EP | 2 761 050 | B1 | 8/2021 |
| WO | 2013/045454 | A2 | 4/2013 |
| WO | 2014/063676 | A1 | 5/2014 |

OTHER PUBLICATIONS

Nedfors, N. et el., "Effect of synchronized bias in the deposition of TiB2 thin films using high power impulse magnetron sputtering," Journal of Vacuum Science Technology A36(3), pp. 1-8, Jan. 1, 2018.

International Preliminary Examination Report mailed Dec. 13, 2022, issued in corresponding International Application No. PCT/EP2021/066499, filed Jun. 17, 2021, 16 pages.

Hu Chuanxin, "Surface Treatment Technical Manual", pressed by Beijing University of Technology, published in Jul. 7, 2009, pp. 696-697.

* cited by examiner

Fig. 1
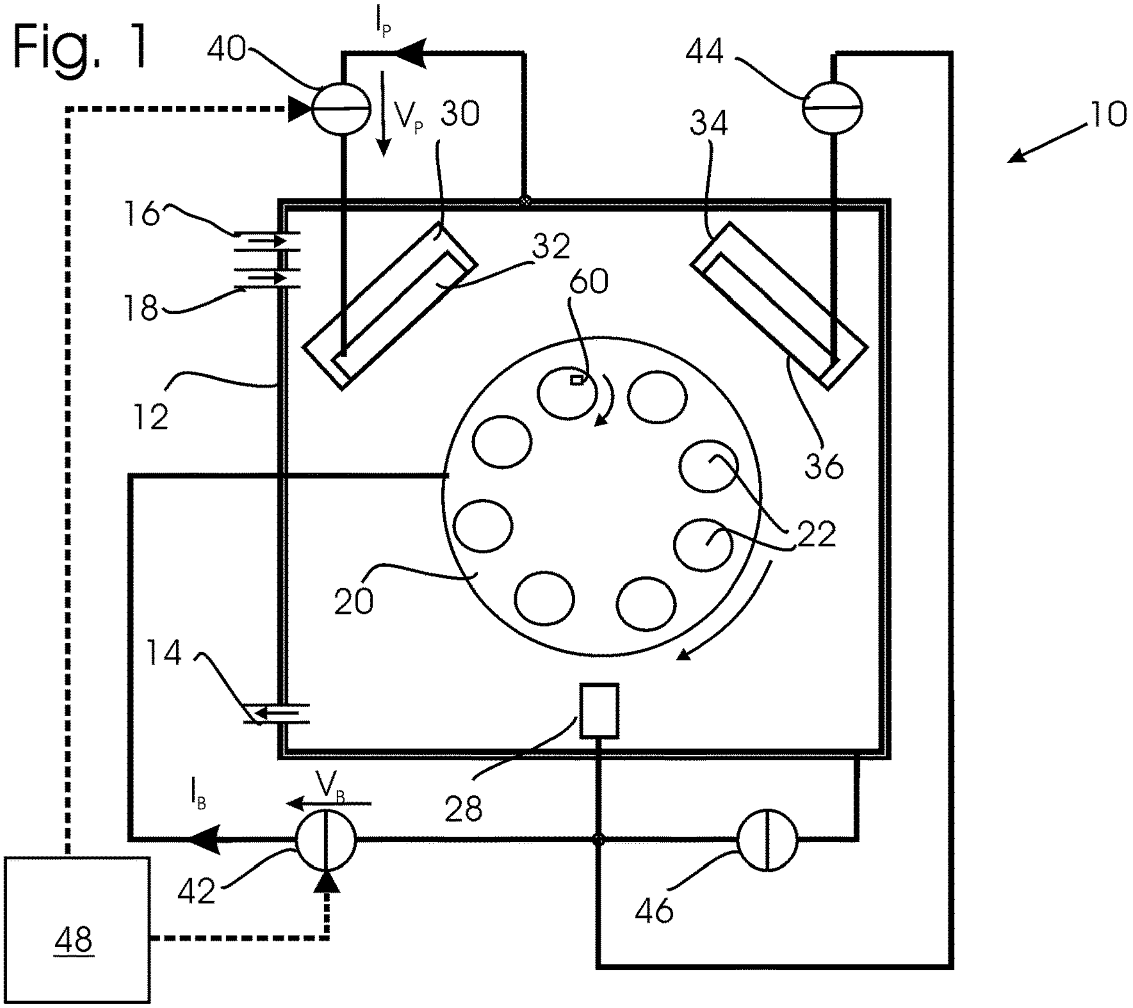
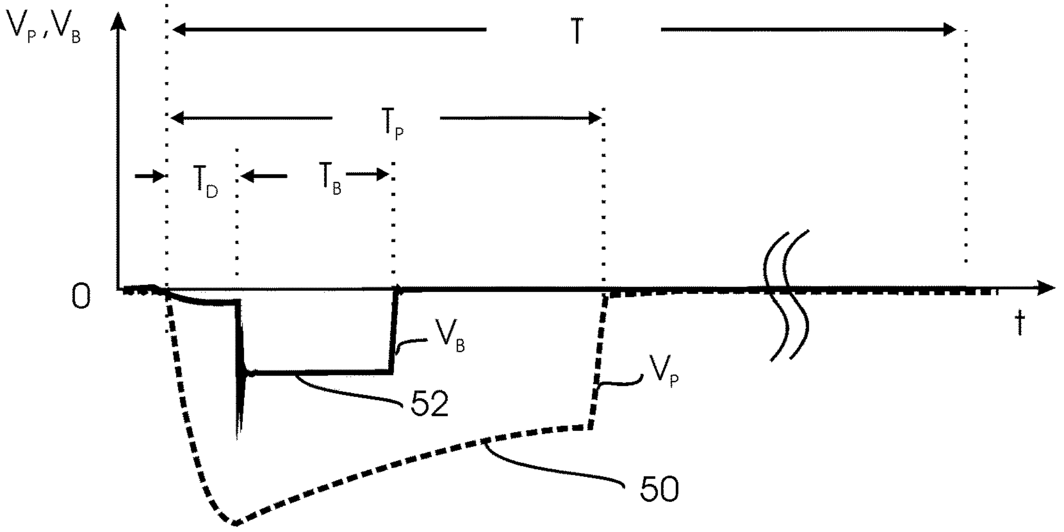
Fig. 2

Fig. 6a
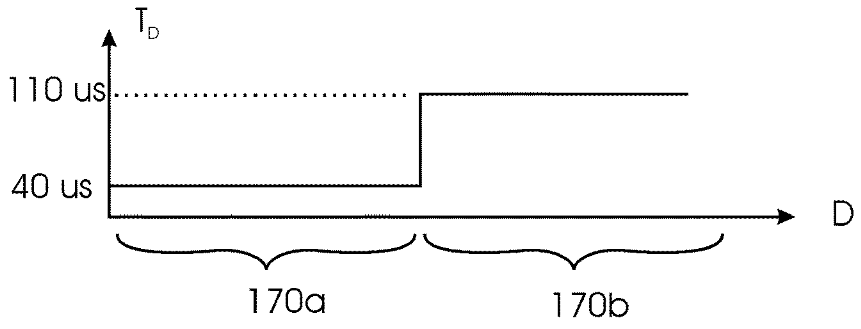
Fig. 6b
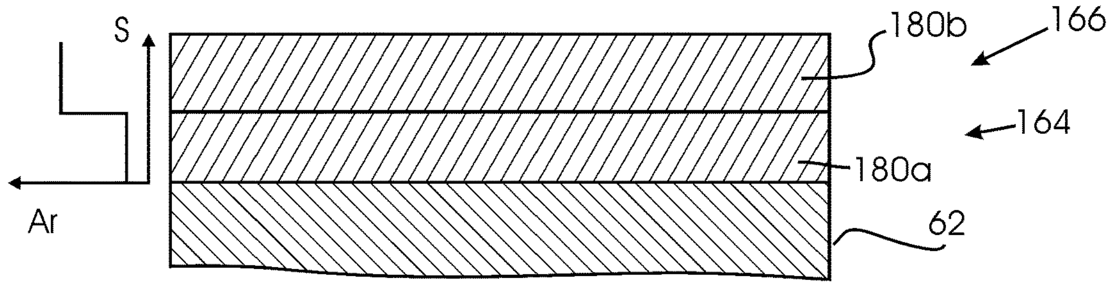
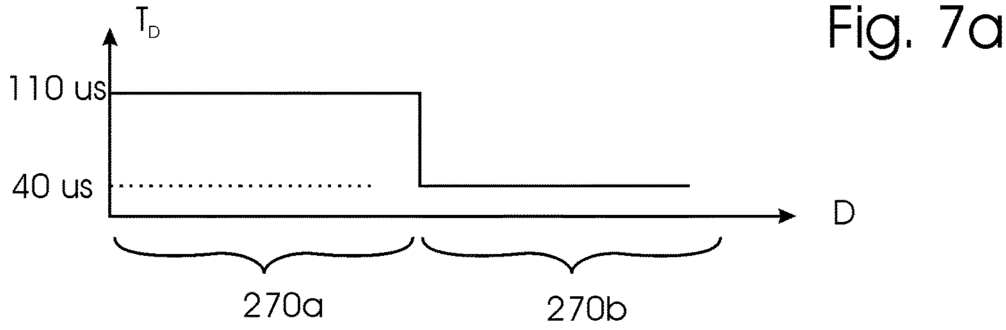
Fig. 7a
Fig. 7b
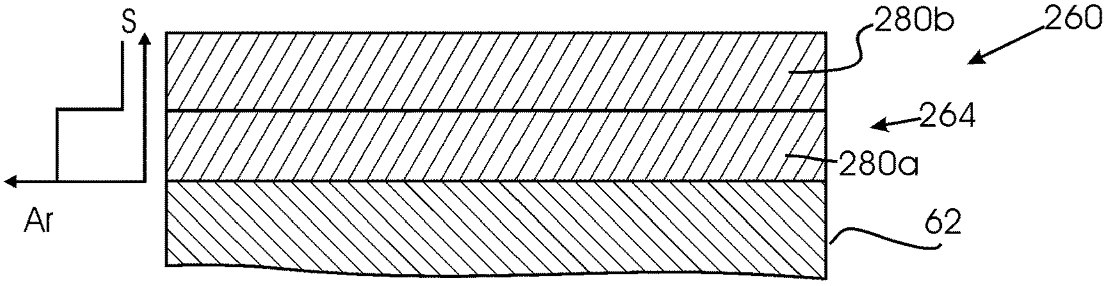

METHOD AND DEVICE FOR APPLYING A COATING

FIELD OF THE INVENTION

The invention relates to methods and devices for applying a layer to a body. In particular, the invention relates to coatings that are generated by cathode sputtering.

BACKGROUND OF THE INVENTION

It is known to provide bodies or parts of bodies with a surface coating in order to improve their mechanical or chemical properties. In particular for tools and components which are subject to wear, it is known to provide functional surfaces with coatings. In particular, hard substance layers are known as coatings.

To form thin coatings, in addition to CVD methods, particularly PVD coating methods are known, in particular the methods of cathode sputtering.

WO 2014/063676 A1 describes a component with a coating made of chromium, nitrogen, and carbon, which is applied in a PVD method with cathodic arc evaporation. In a vacuum chamber, a noble gas is introduced and ion etching initially is performed, using a bias voltage of −800 to −1200 V. The bias voltage is then set to a low value and a layer is applied. Argon can be used as the noble gas, or neon, which leads to lower internal stress than embedded argon.

WO 2013/045454 A2 describes a method and a device for coating substrates. Magnetron cathodes with sputtering targets are disposed in a vacuum chamber. Some of the cathodes are HIPIMS cathodes, i.e., they are operated with electrical power in the form of voltage pulses by means of an HIPIMS power supply. A bias voltage is applied to the substrates to be coated, which voltage has, in preferred embodiments, pulses which are synchronized with the voltage pulses at a cathode such that they are applied during at least a part of a period which is characterized by a high number of metal ions which are generated by the HIPIMS pulse at the cathode. Compared to pulses that are applied for longer or a continuous DC bias, lower amounts of the process gas, for example argon, are thus embedded in the layer.

US 2008/0135401 A1 describes a device for sputtering a target with a current density on a magnetron cathode between 0.1 and 10 $A/cm^2$ in order to generate a coating on a substrate. The device comprises a power supply which is connected to the magnetron and a capacitor which is connected to the power supply. A first switch connects the power supply to the magnetron in order to charge the magnetron in coordination with a first pulse. A bias device is connected to the substrate to preset a substrate bias. A bias can be applied, for example, as RF power in a pulsed mode and synchronized with HIPIMS pulses. A synchronization device synchronizes a frequency and a temporal delay of the first pulse.

EP 3 457 428 A1 describes a method and a device for processing semiconductor substrates. A pulse synchronization controller is connected between a pulse RF bias generator and an HIPIMS generator. A first timing signal is sent from the pulse synchronization controller to the pulse RF bias generator and to the HIPIMS generator. A sputtering target and an RF electrode on a substrate carrier are energized based on the first timing signal and de-energized at the end of the timing signal. A second timing signal is sent from the pulse synchronization controller to the pulse RF bias generator and the electrode is energized and de-energized without the target being energized based on the second timing signal.

SUMMARY OF THE INVENTION

It can be regarded as an object to propose a method and a device for applying a layer to a body, with which particularly favorable layer properties can be achieved in a controlled way.

The object is solved by the method and device according to the invention. Dependent claims refer to advantageous embodiments of the invention.

The inventors started from the consideration that, when generating layers by means of cathode sputtering while applying pulsed voltages to the cathode, the layer composition can be predetermined differently by the temporal curve of the bias voltage. Depending on whether the bias voltage is applied as a DC voltage or pulsed voltage, and in the case of a pulsed voltage as a function of the temporal synchronization with the pulses at the cathode, the components prevailing in the plasma at different points in time can be selected in a controlled way and used to form the layer. In particular when the temporal curve of the gas ions present in the plasma differs from that of the metal ions, as in the HIPIMS method, the proportion of the gas ions relative to the metal ions can thus be set in a controlled way by the time course of the bias voltage.

In contrast to the known teaching of achieving a desired composition of the layer by a suitable time course of the bias voltage which stays the same over the coating duration, the inventors propose achieving different compositions of the layer over the layer thickness in a controlled way through variation of the time course of the bias voltage during the coating duration. This is because, contrary to the previous understanding that gas ions in the layer are generally undesired and must always be minimized, the inventors have recognized that—depending on the desired application of the body, the layer structure, the general layer properties, the type of substrate, etc. —a proportion of gas ions in certain regions of the layer, for example, depending on the present case on the layer surface, in the interface region, or in the middle regions of the layer, can in fact be advantageous, as long as the proportion varies over the layer thickness and can be set in a controlled way.

The gas ions under consideration are primarily ions of noble gases used as the process gas in the vacuum chamber, in particular argon.

Thus, it has been shown that at comparably high proportions of argon, layers can be achieved with very high hardness and high internal stress, i.e., hard and brittle layers, while layers without argon or with a lower proportion are rather ductile in comparison. Surprisingly, it has been shown that for some applications, for example hard machining, layers that have high internal stress at least on the layer surface achieve particularly good results, for example high cutting performance. On the other hand, layer proportions that are rather ductile due to a lower proportion of argon have very favorable properties, for example in the interface region, e.g., for achieving good adhesion to the substrate or—depending on the intended use of the body, for example as a tool—also in the region of the layer surface, for example with regard to tribological properties or for run-in behavior.

To enable a controlled setting of the desired layer formation and the properties resulting from this, the method according to the invention for applying a layer to a body provides that the body is arranged in a vacuum chamber and, by supplying a process gas, for example a noble gas, preferably argon, a plasma is generated by operating one or more cathodes, and at least one target is sputtered. The cathodes are preferably magnetron cathodes, in particular unbalanced magnetrons, which are provided with targets made of a target material, preferably of one or more metals, which material is sputtered so that the plasma comprises gas ions and metal ions (magnetron sputtering).

According to the invention, at least one cathode is operated not with constant voltage, but by a pulsed cathode voltage which has temporally spaced cathode pulses. Preferably, one or more cathodes are operated according to the HIPIMS method (high power impulse magnetron sputtering), in which short cathode pulses with high voltage are applied and very high peak powers are achieved. The HIPIMS method is understood here to mean, in particular, operating within the parameter regions mentioned below as part of possible exemplary embodiments.

During at least a part of the coating duration, a bias voltage is applied to the body to be coated so that charge carriers of the plasma are accelerated into the direction of the body and attached to its surface as a layer. The method according to the invention is characterized in that the time course of the bias voltage varies during the coating duration.

The time course of the bias voltage can be—in the case of a DC voltage—at least in sections a constant time course or a variable time course, in particular a pulsed time course. Variation of the time course during the coating duration in the case of a continuously temporally varying, periodic time course, can be a change in frequency or phase position. According to the invention, a variation of the time course comprises a duration and/or temporal synchronization with the cathode pulses that is different at various points in time or intervals during the coating duration. As explained, the composition of the layer can be influenced by the time course of the bias voltage: While, for example, at constant bias voltage (DC) all ions of the plasma are accelerated uniformly into the direction toward the body, by a pulsed bias voltage, the bias pulses of which are temporally synchronized with the cathode pulses, i.e., are applied with the same frequency and a fixed phase relationship, the species of ions present in the plasma at the selected point in time can each be selected and accelerated into the direction of the item by the duration and temporal position of the pulse.

Accordingly, a bias voltage with a time course that is variable during the coating duration can have a pulsed curve in sections or throughout, wherein the synchronization with the cathode pulses can vary over the coating duration. Likewise, the time course of the bias voltage can be a DC voltage curve in one or more temporal sections, while in other sections a pulsed time course can be applied.

According to the invention, the time course of the bias voltage is pulsed at least during a part of the coating duration, i.e., the bias voltage comprises bias pulses which are synchronized with the cathode pulses, i.e., are applied with the same (or respectively, alternatively a multiple of the) frequency and a fixed phase relationship. The pulses are preferably DC voltage pulses, i.e., an at least basically constant bias voltage is preferably applied during the pulse duration. The time, relative to the cathode pulses, at which the bias pulses are effective can thus be characterized by the respective pulse duration and by the temporal position relative to the cathode pulses (i.e., the time difference of the respective beginning of the pulse before or respectively after the beginning of a cathode pulse, wherein the time difference can also potentially be zero). The variation according to the invention of the time course of the bias voltage during the coating duration is effected in the form of a change of the duration and/or the synchronization (i.e., for example, time difference) of the bias pulses with respect to the cathode pulses, wherein the change of duration and/or synchronization can be abrupt or continuous, for example in the form of a ramp curve.

In each case, due to the variation of the time course of the bias voltage, different conditions for the layer growth result during different points in time or intervals during the coating duration so that, as the layer grown progresses, layers are obtained whose structure and/or composition varies over the layer thickness. It is thus possible to achieve specially suitable properties, for example good adhesion to the substrate, a hard or smooth surface, etc., in various regions of the layer.

The device according to the invention is suitable for carrying out the method according to the invention. It comprises a vacuum chamber with a carrier for the body, a process gas supply and a cathode with a target. The cathode is connected to a cathode power supply, and the body or respectively its carrier is connected to a controllable bias power supply. The cathode voltage with the cathode pulses is generated by means of the cathode power supply, preferably an HIPIMS power supply, and a bias voltage is generated by means of the bias power supply. A controller is provided here, with which the bias power supply can be controlled such that the time course of the bias voltage varies during the coating duration.

The controller can be in particular a programmable controller, with which, preferably in addition to the bias power supply, other functions of the coating device can also be controlled according to a coating program in a time-dependent manner, in particular electrical power supplies of various cathodes and the supply of process and/or reactive gases.

A coated body can be produced, for example, by means of the method according to the invention and/or the device according to the invention. The body comprises a substrate which can be, for example, a base body made, for example, of steel, in particular HSS or CrMo steel, carbide, ceramic material or cBN (cubic boron nitride). The substrate can be, for example, a tool, in particular for machining, such as a drill, a milling cutter, an indexable insert, a punching or stamping tool, etc.

A layer made of a layer material applied by means of cathode sputtering is disposed on the surface of the substrate. The layer material according to the invention comprises at least one element from a first group comprising aluminum (Al), silicon (Si), yttrium (Y), and elements of groups 4-6 of the period table according to IUPAC (1988) and at least one element from a second group comprising nitrogen (N), oxygen (O), carbon (C), and boron (B). The selection of elements of the first and second group can be referred to as a material system. Preferred material systems comprise primarily nitrogen as well as one or more elements of the first group, in particular titanium (Ti), aluminum (Al), silicon (Si), and/or chromium (Cr). Material systems are shown here by naming the respective elements with hyphens, i.e., without indicating the chemical bonds. Particularly prefer-able layer systems are aluminum-titanium-nitride (Al—Ti—N), titanium-nitride (Ti—N), titanium-aluminum-silicon-nitride (Ti—Al—Si—N), titanium-aluminum-chromium-silicon-nitride (Ti—Al—Cr—Si—N), titanium-boride ($TiB_2$), titanium-carbonitride (Ti—C—N), titanium-aluminum-carbonitride (Al—Ti—C—N), chromium-nitride (Cr—N), zirconium-nitride (Zr—N), and titanium-carbide (Ti—C). It is preferred that the indicated elements of each material system are listed in the order of their relative atomic amounts.

The layer material also comprises proportions of a noble gas, preferably argon. Here, in the body according to the invention, the concentration of the noble gas in the layer varies over the layer thickness, i.e., different concentrations of the noble gas within the layer result at different locations of the layer, depending on the distance of each considered location of the layer from the layer surface or respectively the substrate.

The noble gas is the process gas used when applying the layer by means of cathode sputtering, preferably argon. As described above, controlling the proportion of the process gas in the layer is possible in particular through suitable selection of the time course of the bias voltage, so that the desired concentration profile can be set in a controlled way over the layer thickness.

Advantageous developments of the method according to the invention relate in particular to the type of variation of the time course of the bias voltage. Advantageously, as explained, it can be achieved by suitable application that the proportion of the process gas in the layer is dependent on the time course of the bias voltage. By variation of the time course during the coating duration, the desired proportion of process gas in the layer varying over the layer thickness can be achieved in this way.

For the method according to the invention and the device according to the invention, various embodiments are possible. Thus, the bias voltage preferably has a pulse-shaped time course at least during a first time interval within the coating duration, i.e., it comprises voltage pulses which are referred to here as "bias pulses,". The bias pulses are preferably synchronized with the cathode pulses, i.e., have the same frequency (or alternatively one of the frequencies is a multiple of the other frequency, which also represents a synchronization). While a synchronization is also possible in which bias pulses and cathode pulses always begin at the same time, and a lead-in time of the bias pulses is also possible, the bias pulses preferably occur delayed with respect to the cathode pulses by a delay time, i.e., their beginning is temporally after the beginning of the cathode pulses. The delay time can be, for example, in the range of 5-150 μs and is chosen according to the ions preferred in each case. The duration of the bias pulses is, for example in the range of 30-150 μs, preferably 50-100 μs.

During a further time interval, which can be temporally before or after the first time interval during the coating duration, possibly also with a temporal distance between them, the bias voltage then preferably has a time course deviating from the first time interval. This can be, for example, a pulse curve as in the first time interval, but with a deviating phase relationship, in particular a deviating delay time. Likewise, the deviating time course in the further time interval can also be a constant DC voltage (DC bias). By a DC bias voltage, all ions of the plasma are accelerated into the direction toward the substrate without exception and a coating with a relatively high proportion of process gas is formed, compared with a pulsed bias voltage in which, by suitable synchronization with the cathode pulses, a selective selection of ions is possible, so that, for example, a higher proportion of metal ions can be selected in a controlled way.

According to an advantageous embodiment, the time course of the bias voltage during the first time interval comprises bias pulses which are synchronized with the cathode pulses, and occur delayed with respect to the cathode pulses by a first delay time, and during a second time interval bias pulses which are also synchronized with the cathode pulses, but in this case occur delayed with respect to the cathode pulses by a second delay time deviating from the first. The second time interval here is preferably temporally after the first time interval and can either temporally directly follow it or a temporal distance between the time intervals can exist. The first time interval can be at the beginning of the coating duration.

The time intervals can be short, for example, a few minutes, or longer, up to multiple hours. For example, the duration of the first and/or the second time interval can be chosen so that, during it, the layer grows by a low amount of, for example, 0.1 μm, but embodiments are also possible in which the layer grows by up to 3 μm during the first and/or second time interval. To achieve individual layers in the layer with a layer thickness in the nano range, meaning, for example, 5-100 nm, preferably 5-50 nm, the time intervals can be chosen to be very short, for example 20-360, preferably 20-180 seconds. To achieve individual layers in the micro range, meaning, for example, from 0.5-10 μm, preferably 0.5-2 μm, the time intervals can be chosen, for example, in the range from 50-1200 minutes, preferably 50-360 minutes.

For example, one of the delay times can be in a range in which a relatively high proportion of metal ions and, relative to that, lower proportion of gas ions is present in the plasma, for example 30-80 μs, while the other delay time can be chosen so that a relatively high proportion of gas ions is present in the plasma, for example 0-20 its or more than 90 μs. For example, the delay time in the first time interval, which is temporally earlier within the coating duration, can be shorter so that a larger proportion of metal ions is used to form the layer, while the delay time in the second time interval, which is temporally later within the coating duration, is longer so that a higher proportion of gas ions is integrated into the layer.

Preferably, synchronized bias pulses with delay times with respect to the cathode pulses are thus generated during at least one time section or during the entire coating duration, wherein the delay times vary. The variation of the delay times can take place abruptly in steps or also (somewhat) continuously.

To form a transition layer with a gradual change of the layer properties, the variation of the delay times during a transition time interval, which can comprise a section or the entire coating duration, can take place, for example, in steps or continuously from a first value to a second value, wherein the first value is higher or lower than the first value. The course can be, for example, linear in the form of a ramp, but likewise, deviating courses are also possible. The duration of the transition time interval during which the change takes place can be chosen so that, during it, the layer grows by 0.5 μm-20 μm.

In other preferred embodiments, the variation can oscillate between two values in steps or continuously over one section or the entire coating duration, so that, for example, a multilayer structure is formed in the layer, preferably with more than 2 individual layers. Here, the delay time can assume a first value during a first switching subinterval and a second value deviating from it during a second switching subinterval. During a switching time interval, first and second switching subintervals can follow each other once or multiple times. In doing so, the duration of the first and/or of the second switching subinterval can each be chosen so that, during it, the layer grows by 5 nm-2 μm. Preferred examples are a thickness of each individual layer of, for example, 5-100, preferably 5-50 nm for a nanolayer structure and a thickness of each individual layer in the range of, for example, 0.1-2 μm, for example with 6-40 individual layers present in total in the layer, for a multilayer structure.

Further preferred embodiments relate to the device according to the invention. Thus, the device preferably comprises one or more HIPIMS cathodes, i.e., cathodes which are connected to an HIPIMS power supply. The HIPIMS power supply preferably comprises a capacitor for supplying the electrical power for HIPIMS pulses and a charging device for the capacitor. The power supply is preferably power-regulated. Multiple cathodes disposed in the vacuum chamber can be fitted with targets of different compositions. Thus, it is possible to deposit layers of various compositions on top of each other by switching on or off (or respectively increasing/reducing the power) of the associated power supplies in a continuous process without an interruption of the vacuum. This preferably takes place through the controller.

BRIEF DESCRIPTION OF THE DRAWINGS

In the following, embodiments will be further described with reference to drawings. The drawings show:

FIG. 1 a schematic representation of a coating system with electrical circuitry;

FIG. 2 a diagram with a time progression of a cathode pulse and a bias pulse;

FIG. 6*a*, 6*b* a first exemplary embodiment of a coating as a time progression diagram and in a schematic representation of a surface region of a coated body;

FIG. 7*a*, 7*b* a second exemplary embodiment of a coating as a time progression diagram and in a schematic representation of a surface region of a coated body;

DETAILED DESCRIPTION OF EMBODIMENTS

Figure 3:
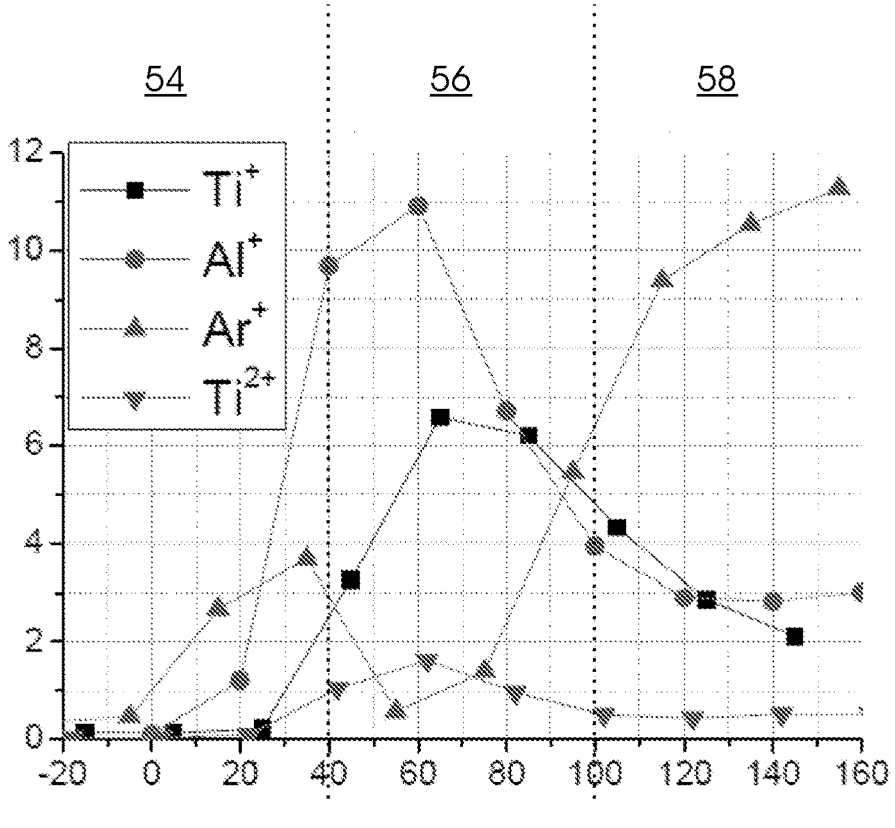
FIG. 3 a diagram with a representation of the amount and type of ions in the plasma in a temporal sequence starting with the triggering of a cathode pulse.

FIG. 1 shows a schematic representation of a coating system 10. The coating system 10 comprises a vacuum chamber 12, shown here schematically from above, with a vacuum system 14, by means of which a vacuum can be generated inside the vacuum chamber 12. The vacuum chamber 12 also has a process gas supply 16 and a reactive gas supply 18, by means of which process gas, in the preferred embodiment argon, and reactive gas, for example nitrogen, can be introduced into the vacuum chamber 12.

A rotating substrate table 20 with planetarily rotating substrate carriers 22 is located within the vacuum chamber 12. Substrates 60 to be coated, i.e., base bodies, for example of tools (see FIG. 12) are respectively disposed on the substrate carriers 22 and are electrically contacted with the substrate carriers 22 and the substrate table 20.

Magnetron cathodes 30, 34 and an anode 28 are also disposed within the vacuum chamber 10. Each of the magnetron cathodes 30, 34 comprises an unbalanced magnet system (not shown) and a plate-shaped sputtering target 32, 36.

The magnetron cathodes 30, 34, the substrate table 20, and the anode 28 are each connected from outside the vacuum chamber 12 to an outer electrical circuitry of the coating system 10 by means of an electrical feedthrough through the wall of the vacuum chamber 12.

In the example shown, the magnetron cathode 34 is wired as a DC cathode, i.e., connected to a DC power supply 44 which supplies a DC voltage to it with respect to the anode 28. The anode 28 is connected to an anode power supply 46 which supplies a DC voltage to it with respect to the conductive wall of the vacuum chamber 12. The magnetron cathode 30 is wired as an HIPIMS cathode, i.e., electrically connected to an HIPIMS power supply 40 which applies a pulsed voltage $V_P$ to it with respect to the chamber wall. The substrate table 20 is connected to a bias power supply 42 which supplies it with a bias voltage $V_B$ with respect to the anode 28.

The coating system 10 is equipped with a controller 48, by which the bias power supply 42 and the HIPIMS power supply 40 are controlled, as will be explained in detail below. In addition, the controller 48 controls the entire process, i.e., also the vacuum system, the rotary drive of the substrate table 20, the supply of process gas and reactive gas, and all other electrical power supplies 44, 46. The controller is programmable, i.e., it comprises a memory for coating programs, with which the procedures and method steps explained below are specified.

It should be noted that the electrical circuitry and the fitting of the coating system 10 with electrodes as shown is to be understood to be purely exemplary. In alternative embodiments, for example, the HIPIMS cathode 30 can be connected with respect to the anode 28, or, for example, the anode 28 can be dispensed with and the chamber wall can be wired as the anode for all cathodes and for the substrate table 20. Multiple or also no DC cathodes 34 can be provided. In addition to the HIPIMS cathode 30, additional HIPIMS cathodes can be provided in the vacuum chamber 12, each connected to its own HIPIMS power supply. The cathodes 30, 34 can be fitted with targets 32, 36 of the same or different compositions.

The HIPIMS power supply 40 supplies electrical power to the HIPIMS cathode 30 in accordance with the HIPIMS method, i.e., the supplied voltage $V_P$, the current $I_P$, and thus the instantaneous electrical power have a time course in the form of short, very high pulses.

As an example, a period duration T of such a periodic time course is shown in FIG. 2. The voltage $V_P$ applied to the HIPIMS cathode 30 is negative. The time course comprises approximately rectangular voltage pulses 50 of a pulse duration $T_P$. For the rest of the period duration T, no voltage is applied.

By way of example, preferred parameters of the HIPIMS method are mentioned below. The voltage $V_P$ is applied periodically with a frequency of, for example, 100-10,000 Hz, preferably 500-4000 Hz, so that the period duration T is preferably in the range of 250-2000 μs. The pulse duration $T_P$ is preferably low, for example shorter than 200 μs, preferably 40-100 μs. Preferably, the duty cycle $T_P/T$ is in the range of 1% to 35%, preferably 10-30%, particularly preferably 20-28%. The operation of the HIPIMS cathode(s) 30 preferably takes place in a power-regulated manner, for example to a value of 3-20 kW per HIPIMS cathode, preferably 10-16 kW per cathode. The peak current resulting during a pulse, in relation to the front face of the target 32, is preferably 0.4-2 A/cm$^2$, further preferably 0.5-0.8 A/cm$^2$.

Figure 12:
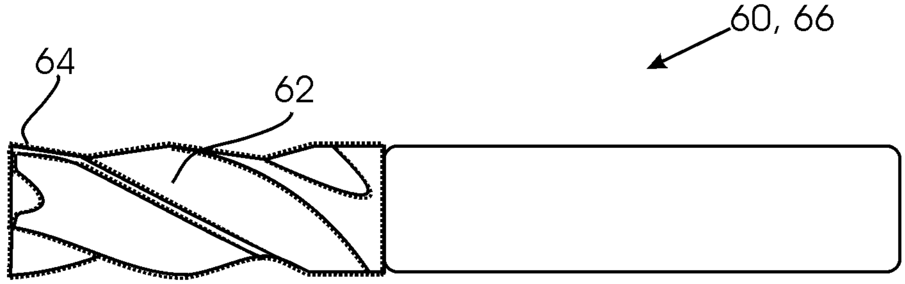
FIG. 12 an exemplary embodiment of a tool with a coating.

When the coating system 10 is operated for applying a coating 64 to the functional region 62 of a substrate 60, as shown by way of example in FIG. 12 for a milling cutter 66, the substrates 60 to be coated are disposed on the substrate carriers 22 within the vacuum chamber 12. A vacuum is generated inside the vacuum chamber 12. After optional preparation steps (for example, heating, surface treatment of the substrates 60 by means of ion etching, sputter cleaning of the cathodes 30, 34, etc.), a plasma is generated by operating one or more HIPIMS cathodes 30 (and, optionally, one or more DC cathodes 34 at the same time) while sputtering the target 32, 36. Components of the plasma attach themselves to the surface of the substrates 60 and form the layer 64, wherein positively charged ions of the plasma are accelerated into the direction toward the substrate surface by the negative bias voltage $V_B$.

FIG. 3 shows, by way of example, the ions measured in the plasma in temporal resolution after the start of a cathode pulse 50 at t=0 μs for an HIPIMS cathode 30 with a target 32 made of titanium and aluminum and while supplying argon as the process gas. As shown, the plasma contains various species of metal and gas ions, wherein, however, the different species show time courses that deviate from each other. Thus, the number of argon ions increases relatively quickly up to a local maximum of approx. 35 μs, then decreases and increases again considerably in the later course starting at approx. t=90 μs. The metal ions increase somewhat more slowly, reach a maximum approximately in the range of t=50-60 μs and then decrease again.

As schematically shown, three time sections 54, 56, 58 can be defined, wherein in the first time section 54 (approx. 0-40 μs) gas ions prevail, in the following second time section 56 (from approx. 40-100 μs) the metal ions prevail, and in the following third time section 58 (from approx. 100 μs) the gas ions prevail considerably.

The positive gas and metal ions of the plasma are accelerated into the direction toward the surface of the substrate 60 by the negative bias voltage $V_B$ and thus become part of the coating 64 attaching itself there. In the case of a DC bias, i.e., a continuous DC voltage as the bias voltage $V_B$, all ions are selected for the layer formation without exception. In FIG. 4*d*, this is shown by way of example in that all three time sections 54, 56, 58 during which the bias voltage $V_B$ is constantly applied are shown crosshatched.

Alternatively to a DC bias, the bias voltage $V_B$ can be applied with a pulsed time course, synchronously to the time course of the voltage $V_P$ at the HIPIMS cathode 30. Such a pulsed time course of the bias voltage $V_B$ is shown by way of example in FIG. 2. The bias voltage $V_B$ has a rectangular pulse 52 (bias pulse) which is applied during a bias pulse duration $T_B$ during the cathode pulse 50. In this case, the bias pulse 52 is temporally delayed with respect to the cathode pulse by a delay time $T_D$.

By suitable selection of the temporal synchronization between the cathode pulses 50 and the bias pulses 52, i.e., in particular by suitable selection of the bias pulse duration $T_B$ and the delay time $T_D$, a selection can be made among the gas and metal ions present in the plasma at various points in time.

Figure 4A:
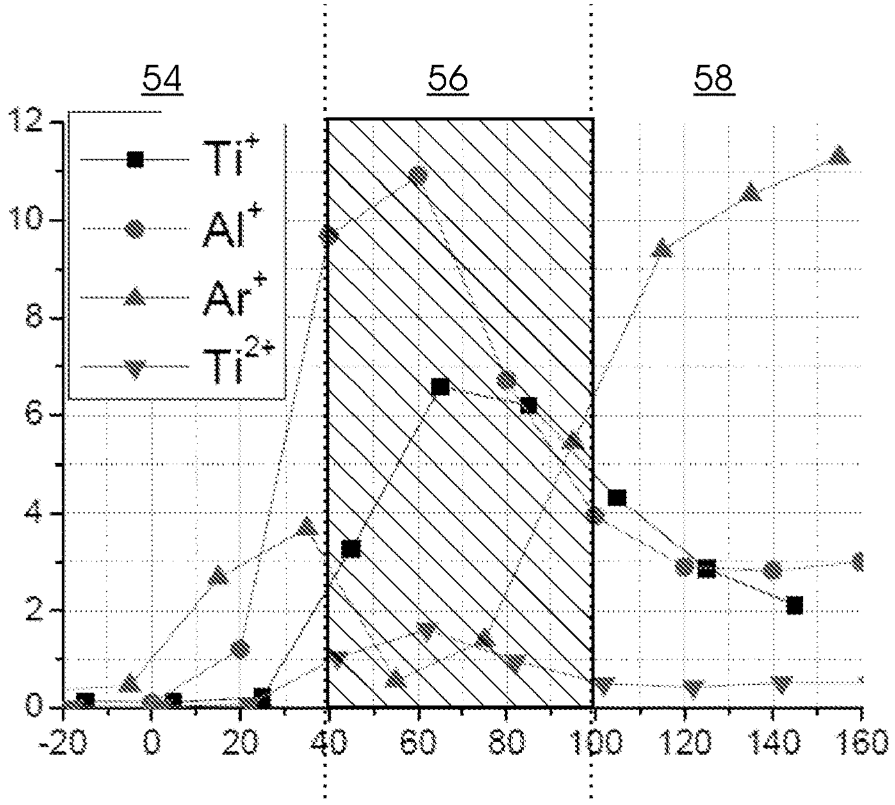
FIG. 4*a*-4*d* diagrams of the temporal superposition of various time courses of the bias voltage with number and type of ions in the plasma in accordance with FIG. 3.

For example, the effect of a presetting of a time course of the bias pulses 52 with a bias pulse duration $T_B$ of approx. 60 s and a delay time $T_D$ of approx. 40 μs is shown in FIG. 4*a*. The bias pulse 52 is thus synchronized with the second time section 56, in which metal ions prevail. By presetting such a time course of the bias voltage $V_B$, a coating 64 with a very low proportion of argon is generated.

In experiments with an HIPIMS target 32 made of titanium, silicon, and aluminum and supplying nitrogen as the reactive gas for depositing a coating 64 made of a Ti—Al—Si—N material system, with the time course of the bias voltage $V_B$ illustrated in FIG. 4*a* a proportion of argon of 0.03 at % in the coating 64 resulted. The coating 64 had an internal stress of −1.6 GPa and a hardness of 26 GPa.

In comparison to this, with an otherwise identical configuration and process control with the application of a DC bias (FIG. 4*d*), a proportion of argon in the coating 64 of 0.12 at %, an internal stress of −5.3 GPa, and a hardness of 30 GPa was shown.

Figure 4B:
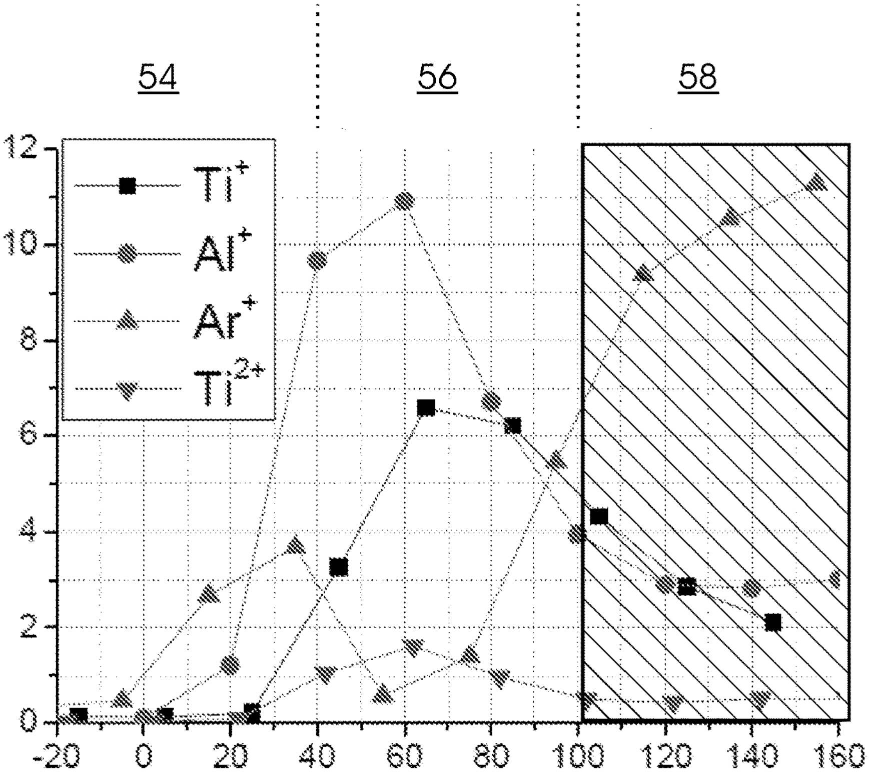

As a further example of a possible time course of the bias voltage $V_B$, FIG. 4*b* shows a time course with a bias pulse duration $T_B$ of approx. 60 μs and a delay time $T_D$ of approx. 100 μs, so that the bias pulse 52 is synchronized with the third time section 58, in which gas ions prevail. By presetting this time course of the bias voltage $V_B$, a coating 64 with a high proportion of argon is therefore generated.

Figure 4C:
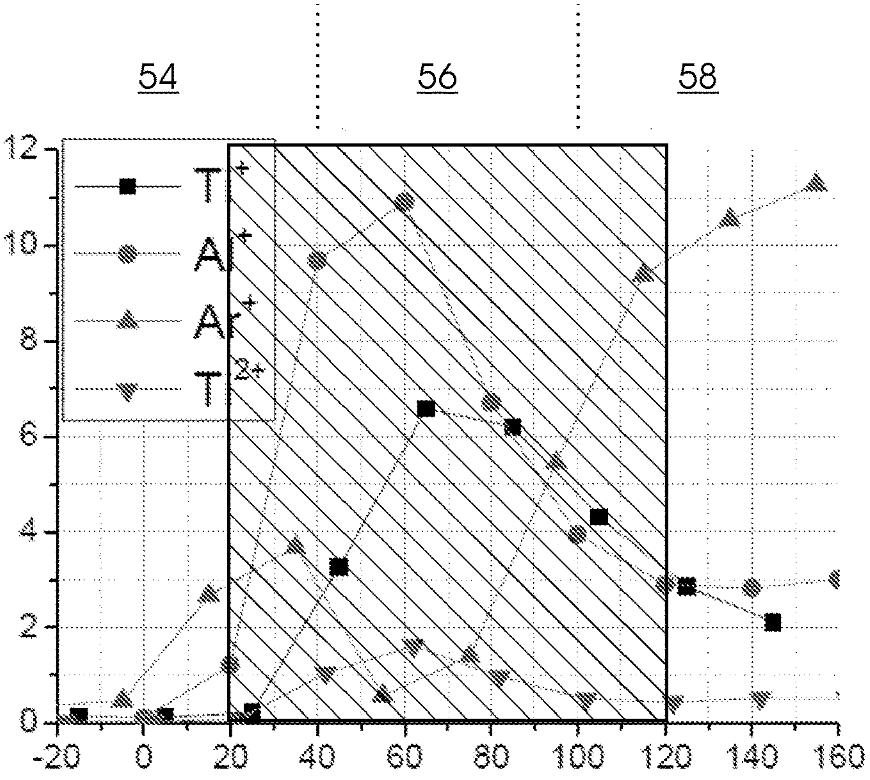
Figure 4D:
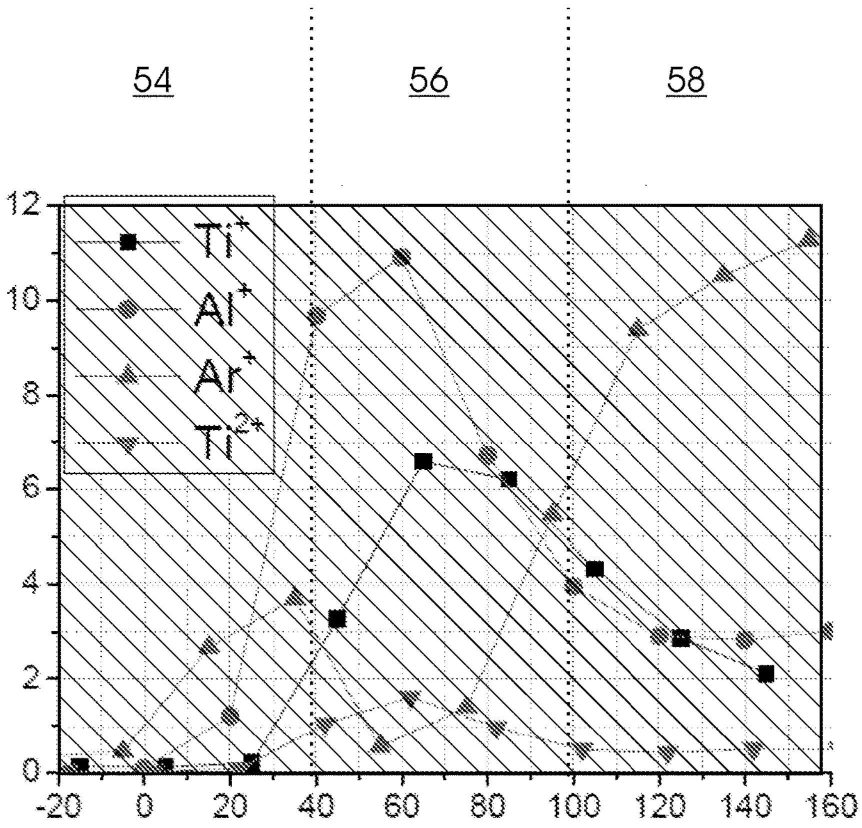

As another example, FIG. 4*c* shows the effect of a time course of the bias voltage $V_B$ with a bias pulse duration $T_B$ of approx. 100 μs and a delay time $T_D$ of approx. 20 μs. The bias pulse 52 covers the second time section 56 completely and the first and third time sections 54, 58 partially in each case. By presetting this time course of the bias voltage $V_B$ a coating 64 with a moderate proportion of argon is generated.

Thus, by presetting the time course of the bias voltage $V_B$, it is possible to influence the layer composition and in particular to set the proportion of argon in a controlled way to a value between a minimum proportion (FIG. 4*a*) and a maximum proportion (FIG. 4*b*).

As a result, the layer properties are considerably influenced, in particular the internal stress in the coating 64 and its hardness.

By means of the coating system 10, coatings 64 are applied to each of the substrates 60. These coatings grow with the progressing coating duration D so that they each have a thickness S starting from the surface of the substrate 60. By means of the controller 48, both the HIPIMS power supply 40 and the bias power supply 42 are controlled during the coating duration D so that, in various time intervals during the coating duration D, time courses of the bias voltage $V_B$ that deviate from each other can be set. This results in a varying composition of the coating 64 over the layer thickness S, namely a different respective proportion of argon depending on the time course set in each case.

With bias pulses 52 synchronized with the cathode pulses 50 (FIG. 2), the time course can be characterized by the delay time $T_D$ and the bias pulse duration $T_B$. By way of example, the bias pulse duration $T_B$ can be set from this to a fixed value of, for example, 60 μs, while the delay time $T_D$ varies depending on the coating duration D.

Figure 5:
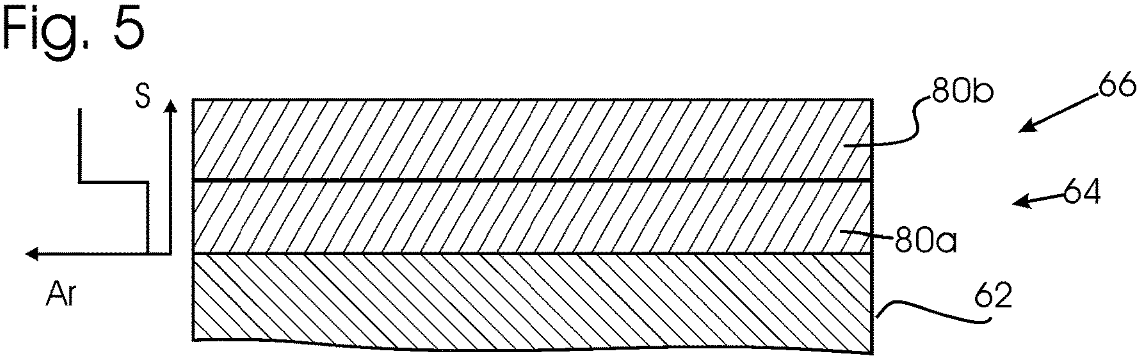
FIG. 5 an exemplary embodiment of a coating in a schematic representation of a surface region of a coated body.

An exemplary embodiment is explained below with reference to FIG. 5, in which a two-layer coating 64 is deposited on a substrate 62 by a one-time change of the synchronization of the bias voltage $V_B$ during the coating duration.

To apply the coating 64, initially the body 60 to be coated, made of substrate material 62, is positioned on the substrate carrier 22 within the vacuum chamber 12, for example a double-bladed ball end mill with a 6 mm diameter made of carbide (WC/Co) with a 6 at % cobalt content.

The coating system 10 is fitted with four HIPIMS cathodes 30, which are disposed around the substrate table 20. Each two cathodes 30 disposed next to each other are fitted with targets 32 made of titanium aluminum material (for example, 60 at % Ti, 40 at % Al) and the two remaining are fitted with targets 32 made of titanium silicon material (for example, 80 at % Ti, 20 at % Si).

By operating the vacuum system 14, a vacuum is produced. The inside of the vacuum chamber 12 is heated up. The surface of the substrate 60 is cleaned by gas ion etching while the cathodes 30, 34 are operated. The targets 32, 36 are prepared by sputter cleaning.

At the beginning of the coating, initially a first layer 80*a* is deposited on the substrate 60 in a first time interval. For this purpose, the two cathodes 30 with Al-Ti targets are operated, each with 12 kW of cathode power, while the two remaining cathodes 30 with Ti—Si targets are initially not operated. The electrical power is supplied in the form of HIPIMS cathode pulses 50 with a frequency of 4000 Hz, pulse length 70 μs. A bias voltage $V_B$ is applied thereby to the substrate 60 via the substrate table 20 and the substrate carrier 22. The bias voltage $V_B$ is pulsed with bias pulses 52 of 60 V and a bias pulse duration $T_B$ of 40 μs, which are synchronous with the cathode pulses 50 but occur with a delay time $T_D$ of 40 μs.

The first layer Boa is deposited with a layer rate of approximately 1 μm/h so that it reaches a thickness of 1.5 μm after the duration of the first time interval of 1.5 h. Due to the pulsed bias voltage $V_B$ with a delay time $T_D$ of 40 μs, metal ions are selected in a controlled way to form the coating 64, while argon ions, which first increasingly occur in the later temporal curve of each pulse, are only present to a low degree (cf. FIG. 4*a*). The argon content of the coating 64 in the first layer Boa is less than or equal to 0.03 at %, so that internal stress of less than or equal to −1.6 GPa results.

Subsequently, in a second time interval, a second layer Bob is deposited onto the 1.5 μm thick first layer 80*a*. For this purpose, in the further execution of the coating program, the controller 48 controls the power supplies of the two cathodes 30 with Ti—Si targets such that they are each operated with 12 kW of cathode power, while the two remaining cathodes 30 with Al—Ti targets are not operated. The HIPIMS parameters of the electrical power supply in the second time interval are the same as in the first time interval, i.e., frequency of 4000 Hz, pulse length 70 μs.

However, in the transition from the first to the second time interval, a variation of the time course of the bias voltage $V_B$ is made such that it is not applied in the second time interval with a pulsed time course, but rather as a continuous DC voltage, so that argon ions are also contained in the coating 64 to a considerable extent.

The second layer Bob is deposited with a layer rate of approximately 1 μm/h so that it reaches a thickness of 1.5 μm after the duration of the second time interval of 1.5 h. Due to the non-pulsed bias voltage $V_B$, the argon content of the coating 64 in the second layer Bob is at least 0.12 at %, such that internal stress of at least 5.3 GPa results.

As a result, the layer 64 is two-layered, wherein the first layer 80*a* achieves very good layer adhesion due to the low internal stress and higher ductility, while the outer, second layer 80*b* ensures a hard, smooth surface of the coated body 60. The ball end mill coated in this way is suitable for milling high-carbon steel of more than 60 HRC without emulsion.

In the following, further individual exemplary embodiments in which coatings 164, 264, 364, 464, 564, 664 are generated on the substrate 62 are shown, wherein the composition and the properties of the coatings are changed in each case by variation of the time course during the coating duration, in particular by changing the synchronization of the bias voltage $V_B$. In the following representation, all further details of the coating procedure will not be mentioned, for example fitting the targets and the concrete parameters and time durations, since it is primarily about showing principal embodiments, which can be applied to various material systems and with various parameters.

FIG. 6*a*, 6*b* show a first exemplary embodiment of a coated body 166 with a two-layer coating 164.

When depositing the coating 164, the bias voltage $V_B$ is applied in each case with a pulsed time course with bias pulses 52 which are synchronized with the cathode pulses 50. However, as shown in FIG. 6*a*, the synchronization is changed during the coating duration D. Thus, in a first time interval 170*a*, the delay time $T_D$ is initially 40 μs and in a following second time interval 170*b* is 110 μs.

FIG. 6*b* schematically shows a cross-section through a correspondingly coated body 166 with the resulting coating 164 on the substrate 62. The coating 164 comprises a first layer 180*a* on the substrate 62 with a low proportion of argon and a second layer 180*b* on top of it with a higher proportion of argon. The first layer 180*a* is rather ductile and has low internal stress due to the lower proportion of argon, so that it can serve as a good adhesion agent to the substrate 62. The second, outer layer 180*b* has a high hardness due to the higher proportion of argon. It has been shown that such a layer is particularly suited for tools which are used for demanding machining applications, for example for drilling and milling tools such as end mills, ball end mills, and indexable inserts.

FIG. 7*a*, 7*b* schematically show a second exemplary embodiment with process control that is essentially opposite to the first exemplary embodiment. In the second exemplary embodiment, the delay time $T_D$ is changed from initially 110 μs in a first time interval 270*a* to 40 μs in a following second time interval 270*b*. A resulting coating 264 of the coated body 260 has a first layer 280*a* with a high proportion of argon and a second layer 280*b* with a lower proportion of argon.

Such a coating 264 can be advantageous especially for coated bodies 260 which are provided for tribological applications. The first layer 280*b* serves as a hard base layer with internal stress. The second layer 280*b* serves as a top layer on top of it, which has good run-in properties due to the higher ductility. Possible applications can include thread-cutting taps, forming taps, drills, and punching and stamping tools.

Figure 8A:
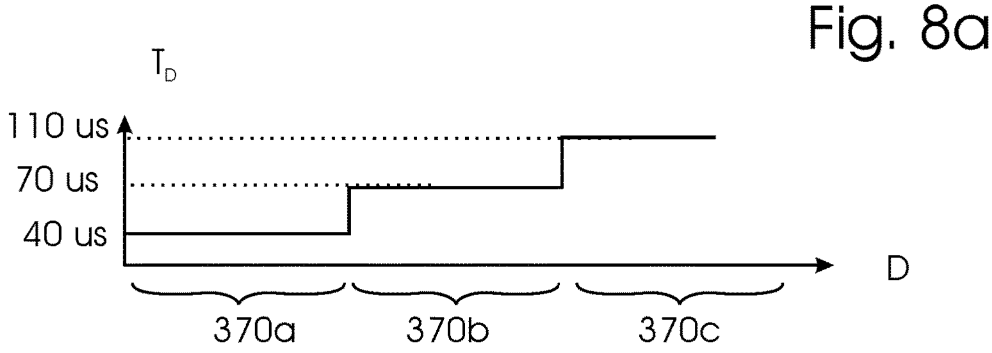
FIG. 8*a*, 8*b* a third exemplary embodiment of a coating as a time progression diagram and in a schematic representation of a surface region of a coated body.
Figure 8B:
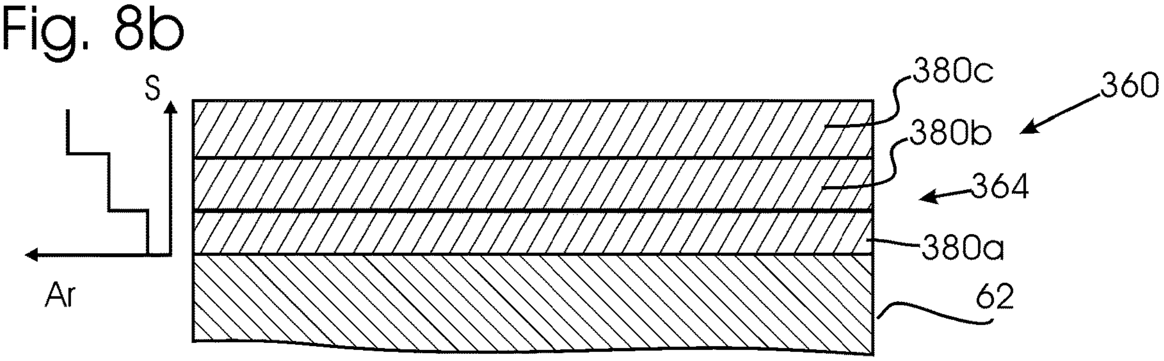

FIG. 8*a*, 8*b* schematically shows a third exemplary embodiment. The third exemplary embodiment shows a course of the delay time $T_D$ varying in steps in three time intervals 370*a*, 370*b*, 370*c* over the coating duration D. In this case, the delay time $T_D$ increases in steps as in the first exemplary embodiment. A resulting coating 364 of the coated body 360 has a first layer 380*a* with a low proportion of argon, a second layer 380*b* with a moderate proportion of argon, and a third, outer layer 380*c* with a high proportion of argon.

Figure 9A:
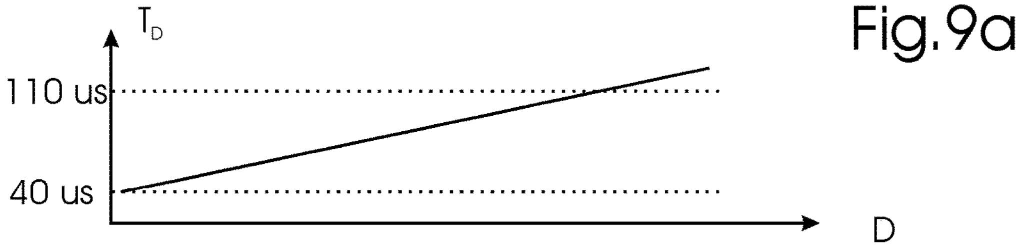
FIG. 9*a*, 9*b* a fourth exemplary embodiment of a coating as a time progression diagram and in a schematic representation of a surface region of a coated body.
Figure 9B:
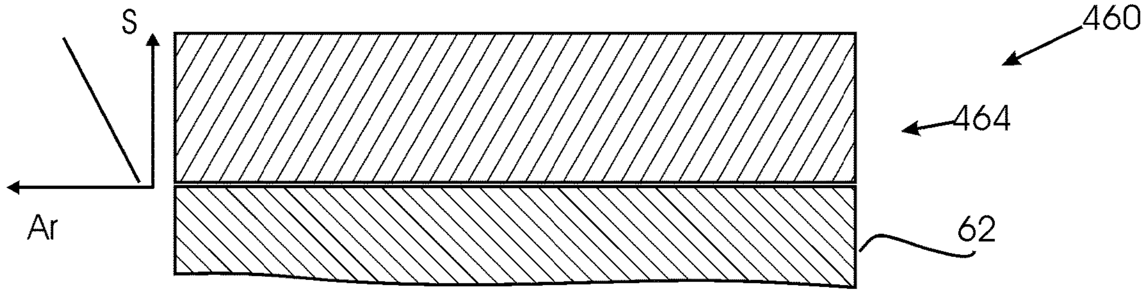

FIG. 9*a*, 9*b* show a fourth exemplary embodiment, in which the delay time $T_D$ and thus also the proportion of argon does not change over the coating duration in steps but gradually, here, for example, in the form of a linearly increasing ramp. The thus generated coating 464 of the coated body 460 shows, accordingly, an argon content increasing from the substrate 62 in the direction towards the surface. The coating 464 thus has only low internal stress in the interface region to the substrate 62, which promotes adhesion. In the region of the surface, the coating 464 has a high hardness, so that it is advantageous in particular for tools for machining applications.

Figure 10A:
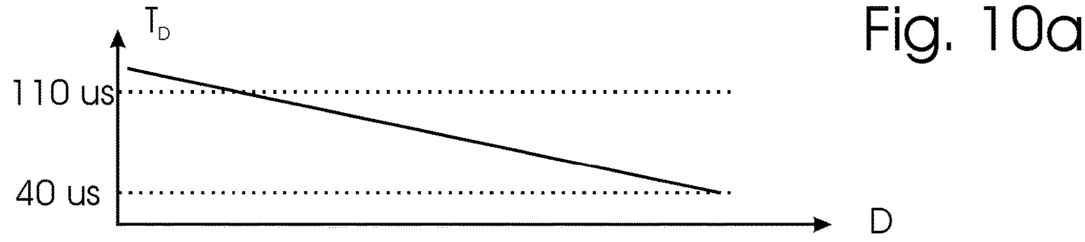
FIG. 10*a*, 10*b* a fifth exemplary embodiment of a coating as a time progression diagram and in a schematic representation of a surface region of a coated body.
Figure 10B:
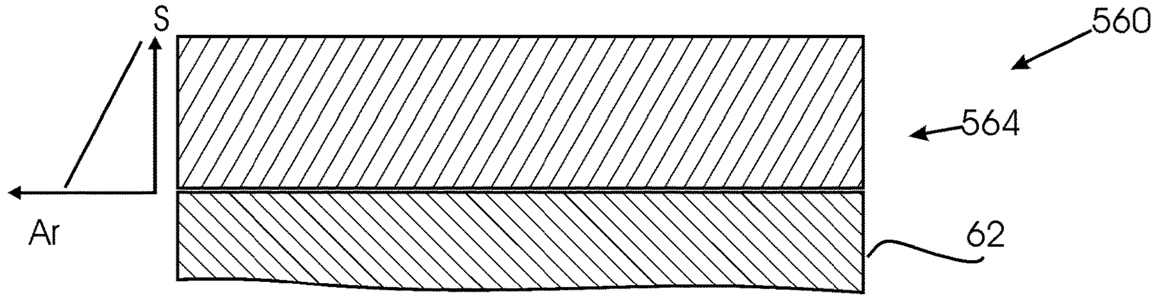

In FIG. 10*a*, 10*b*, a fifth exemplary embodiment with process control opposite to the fourth exemplary embodiment is shown, i.e., the delay time $T_D$ and the argon content in the coating 564 of the coated body 560 become constantly lower over the coating duration D, here in the form of a linearly decreasing ramp.

Figure 11A:
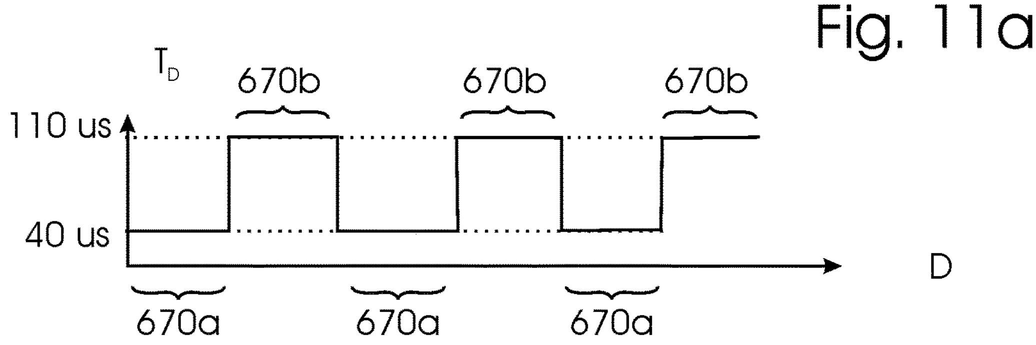
FIG. 11*a*, 11*b* a sixth exemplary embodiment of a coating as a time progression diagram a schematic representation of a surface region of a coated body.
Figure 11B:
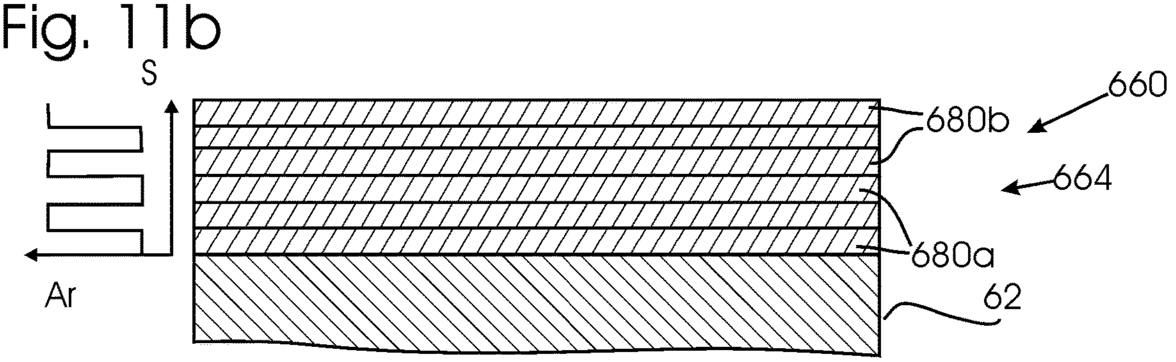

FIG. 11*a*, 11*b* show a sixth exemplary embodiment, in which the delay time $T_D$ changes abruptly in first time intervals 670*a* and second time intervals 670*b* following repeatedly one after another during the coating duration D. During the first time intervals 670*a*, the delay time $T_D$ is 40 μs and during the second time intervals 670*b* the delay time $T_D$ is 110 μs.

The resulting coating 664 of the coated body 660 has as a result first layers 680*a* with a low argon content and second layers 680*b* with a higher argon content following alternately one after the other in the direction of the layer thickness S. The layer disposed directly on the substrate 62 in the interface region is a first layer 680*a* with low internal stress, which promotes adhesion. The outermost layer in the region of the surface is a second layer 680*b* of high hardness.

The thickness of the layers 680*a*, 680*b* is preset by the duration of the time intervals 670*a*, 670*b* at a constant layer rate. By selecting the time durations of the time intervals 670*a*, 670*b* and the number of switches accordingly, multilayer coatings 664, for example, with a thickness of the individual layers 680*a*, 680*b* of, for example, 0.1-2 μm can be generated. Likewise, a nanolayer coating 664 with a thickness of the individual layers 680*a*, 680*b* of, for example, 5-50 nm can be generated by switching the time intervals 670*a*, 670*b* more quickly.

The following table 1 shows other exemplary embodiments of coatings:

| No. | Layer material | Layer structure | Profile of the Ar concentration over the layer thickness | Layer thickness |
|---|---|---|---|---|
| 1 | Al—Ti—N | Monolayer, graded | Ramp-like increase up to the surface | 0.5-20 μm |
| 2 | Ti—$B_2$ | Monolayer, graded | Ramp-like increase up to the surface | 0.5-5 μm |
| 3 | Ti—C—N | Monolayer, graded | Ramp-like decrease up to the surface | 0.5-3 μm |
| 4 | Ti—N | Monolayer, graded | Ramp-like increase up to the surface | 0.1-2 μm |
| 5 | 1st layer Al—Ti—N 2nd layer Ti—Al—C—N | Two-layer, stepped | Decreasing in steps: 1st layer a lot of argon, 2nd layer little argon | 1st layer 0.5-3 μm 2nd layer 0.1-1.5 μm |
| 6 | 1st layer Al—Ti—N 2nd layer Ti—C—N | Two-layer, stepped | Decreasing in steps: 1st layer a lot of argon, 2nd layer little argon | 1st layer 0.5-3 μm 2nd layer 0.1-1.5 μm |
| 7 | 1st layer Al—Ti—N 2nd layer Ti—C | Two-layer, stepped | Decreasing in steps: 1st layer a lot of argon, 2nd layer little argon | 1st layer 0.5-3 μm 2nd layer 0.1-1.5 μm |
| 8 | As in example 5, 6, or 7 | Two-layer, stepped, graded transition | Graded decrease: 1st layer a lot of argon, 2nd layer graded reduction to less argon | 1st layer 0.5-3 μm 2nd layer 0.1-1.5 μm |
| 9 | 1st layer Al—Ti—N 2nd layer Ti—Si—N | Two-layer, stepped | Increasing in steps: 1st layer little argon, 2nd layer a lot of argon | 1st layer 0.5-10 μm 2nd layer 0.1-20 μm |
| 10 | 1st layer Al—Ti—N 2nd layer Ti—Al—Si—N | Two-layer, stepped | Increasing in steps: 1st layer little argon, 2nd layer a lot of argon | 1st layer 0.5-10 μm 2nd layer 0.1-20 μm |
| 11 | 1st layer Al—Ti—N 2nd layer Ti—Al—Cr—Si—N | Two-layer, stepped | Increasing in steps: 1st layer little argon, 2nd layer a lot of argon | 1st layer 0.5-10 μm 2nd layer 0.1-20 μm |
| 12 | 1st layer Al—Ti—N 2nd layer Ti—N | Two-layer, stepped | Increasing in steps: 1st layer little argon, 2nd layer a lot of argon | 1st layer 0.5-10 μm 2nd layer 0.1-2 μm |
| 13 | 1st layer Al—Ti—N 2nd layer Zr—N | Two-layer, stepped | Increasing in steps: 1st layer little argon, 2nd layer a lot of argon | 1st layer 0.5-10 μm 2nd layer 0.1-2 μm |

-continued

| No. | Layer material | Layer structure | Profile of the Ar concentration over the layer thickness | Layer thickness |
|---|---|---|---|---|
| 14 | 1st layer Al—Ti—N<br>2nd Ti—N or Zr—N<br>or C | Two-layer, stepped | Increasing in steps: 1st layer little argon, 2nd layer a lot of argon | 1st layer<br>0.5-10 μm<br>2nd layer<br>0.1-2 μm |
| 15 | 1st layer Al—Ti—N<br>2nd layer Ti—Al—Cr—Si—N<br>or Ti—C—N<br>or Ti—C or C | Two-layer, stepped, graded transition | Graded increase: 1st layer little argon, 2nd layer graded increase up to higher argon content | 1st layer<br>0.5-10 μm<br>2nd layer<br>0.1-2 μm |
| 16 | As in example 5, 6, 7, or 15 | Multilayer (more than 2 layers) | Alternating layers with higher and lower argon content | Individual layers each 0.5-2 μm |
| 17 | As in example 5, 6, 7, or 15 | Nanolayers | Alternating layers with higher and lower argon content | Individual layers each 5-50 nm |

The coating according to example 1 can be applied, for example, to tools such as milling cutters, drills, indexable inserts, or similar made of steel, stainless steel, or CrMo steel as a substrate material. They are standard layers with little internal stress in the interface region and higher internal stress toward the surface.

In example 2, they are layers for special applications with little internal stress in the interface region and higher internal stress toward the surface (particularly smooth layers). These can be applied, for example, to tools such as milling cutters, drills, indexable m inserts for machining aluminum, titanium, or non-ferrous metals. Possible applications are demanding machining applications for special materials in which material buildup should be avoided, meaning smooth layers are required.

According to example 3, the content of argon is high at the beginning of the deposition and is reduced toward the surface. Such layers can be used, for example, for thread-cutting taps, forming taps, drills, or punching and stamping tools. Steel, stainless steel or CrMo steel, for example, can serve as the substrate material. The layers are characterized by a hard base layer with higher internal stress and a soft top layer with good run-in properties and low internal stress. Possible applications of tools with such layers are, in particular, tribological applications.

In example 4, a graded increase in the argon content toward the surface of the coating takes place, so that it is smooth and visually appealing. Such layers can be used for all types of machining tools and all types of substrate materials. Possible applications are, for example, of a decorative nature. A colored top layer can be applied in a separate process.

The layers according to examples 5, 6, and 7 provide, on the one hand, a modified composition of the layers following each other and, on the other hand, a modification of the argon content. This can be achieved, for example, in that various HIPIMS magnetron cathodes in the vacuum chamber are fitted with targets made of different materials and controlled separately from each other. By switching off the power supply of a first cathode which is fitted, for example, with an Al—Ti target and simultaneously switching on the power supply of a second cathode which is fitted with a Ti—C target, the change from the first to the second layer, for example, in example 5 can take place. The switching on and off of the correspondingly fitted cathodes can take place abruptly or gradually in the form of a short ramp.

In example 6, a first cathode is fitted with an Al—Ti target and a second cathode is fitted with a Ti—C target; switching between the cathodes takes place when the layers are changed.

In example 7, the second cathode is fitted with a Ti—C target and the supply of nitrogen as a reactive gas is switched off at the beginning of the deposition of the second layer.

In all three examples 5, 6, and 7, the argon content is reduced abruptly at the beginning of the second layer. The layers generated thus can be applied, for example, to tools such as thread-cutting taps, forming taps, drills, punching and stamping tools made of substrate materials such as steel, stainless steel, or CrMo steel. Applications are, for example, tribological applications, for which is it favorable that the generated layers have a hard base layer with internal stress and a softer top layer with good run-in properties and little internal stress.

The layer according to example 8 can be used for the same types of tools, substrate materials and applications as according to examples 5, 6 and 7. In contrast to the abrupt, stepped reduction in the argon content during the coating duration, according to example 8 the argon content is reduced gradually, i.e., in the form of a ramp.

The layers according to the examples 9, 10, and 11 also provide a modified composition of the layers, which is achieved by cathodes with different fitting of targets and correspondingly changed electrical control. The layers can be applied, for example, to tools such as end mills, ball end mills, drills, or indexable inserts made of substrate materials such as high-carbon steel, Ni-based alloys, titanium alloys, or stainless steel. Possible applications of the resulting layers, which are hard and smooth (property of the second layer as a functional layer with a high argon content) and have good adhesion (property of the first layer which, with a low argon content, serves as an adhesion agent), are in particular demanding machining applications.

Examples 12, 13, and 14 can serve for applications such as decorative layers on all types of functional layers or respectively layers for better wear detection. Such layers can thus be applied, for example, in a combined method to other layers as the top finish. All types of machining tools can be considered as substrates, made, for example, of steel, cast iron, CrMo steel, or stainless steel. The lower layer serves as a functional layer and the upper layer as a decorative color layer with, for example, a golden color, which enables good wear detection.

With a graded transition of the argon content, example 15 represents an alternative for the same applications and substrates as examples 12, 13, and 14. In the mentioned variant with a second layer of carbon (C), a gray top layer is generated, which enables simple visual wear detection.

In the multilayer layers according to example 16 and the nanolayer layers according to example 17, layers with a high argon content (i.e., high hardness, high internal stress) alternate with those with a low argon content. The constant alternation prevents crack formation and achieves low internal stress of the overall system. Such layers can be provided for all types of machining tools and for substrate materials such as steel, in particular stainless steel, high-carbon steel, CrMo, Ni-based alloys, titanium alloys.

In summary, the invention can be implemented by various coating methods, coating devices, and resulting coated bodies, wherein the individual embodiments each offer specific advantages for various applications. The embodiments mentioned in detail here each represent examples and are to be understood as illustrative and not restrictive. Various modifications and alternatives to the embodiments shown are possible. For example, the aforementioned embodiments can be implemented with a wide variety of layer materials, i.e., with deviating target fitting and with supplying various reactive gases or also without supplying a reactive gas. The advantage always remains that the resulting coatings can be optimized for the respective applications by controlled setting of properties in various layer regions.

The invention claimed is:

1. A method for applying a layer to a body, comprising disposing the body in a vacuum chamber,
supplying a process gas into the vacuum chamber,
generating a plasma in the vacuum chamber by operating at least one cathode by applying a cathode voltage with cathode pulses and sputtering a target,
applying a bias voltage to the body so that charge carriers of the plasma are accelerated towards the body and attached to its surface during a coating duration,
wherein a time course of the bias voltage comprises bias pulses during at least a part of the coating duration, wherein the bias pulses are synchronized with the cathode pulses such that they have a defined phase relation to the cathode pulses,
and wherein the time course of the bias voltage varies during the coating duration by a change of a duration and/or phase relation of the bias pulses over a plurality of the cathode pulses.

2. The method according to claim 1, wherein
a proportion of the process gas in the layer is dependent on the time course of the bias voltage,
and wherein, by variation of the time course of the bias voltage during the coating duration, the proportion of process gas in the layer varies.

3. The method according to claim 1, wherein
the time course of the bias voltage comprises bias pulses at least during a first time interval,
wherein the bias pulses are synchronized with the cathode pulses,
and wherein the bias pulses occur delayed with respect to the cathode pulses by a delay time.

4. The method according to claim 3, wherein
during the first time interval, the bias pulses occur delayed with respect to the cathode pulses by a first delay time,
and the time course of the bias voltage comprises, at least during a second time interval, bias pulses which are synchronized with the cathode pulses and occur delayed with respect to the cathode pulses by a second delay time,
wherein the first and the second delay times differ.

5. The method according to claim 4, wherein
the duration of the first time interval and/or the second time interval is chosen so that, during it, the layer grows by 0.1 μm-3 μm.

6. The method according to claim 4, wherein
the first time interval is before the second time interval within the coating duration,
and the delay time in the first time interval is shorter than in the second time interval.

7. The method according to claim 6, wherein
the first time interval is at the beginning of the coating duration.

8. The method according to claim 3, wherein
the delay time changes during a transition time interval in steps or continuously from a first value to a second value.

9. The method according to claim 8, wherein
the duration of the transition time interval is chosen so that, during it, the layer grows by 0.5 μm-20 μm.

10. The method according to claim 3, wherein
during a first switching subinterval the delay time has a first value and during a second switching subinterval the delay time has a second value
and during a switching time interval, alternating first and second switching subintervals follow each other.

11. The method according to claim 10, wherein
the duration of the first and/or of the second switching subinterval is each chosen so that, during this time, the layer grows by 5-500 nm.

12. The method according to claim 1, wherein
at least one of the cathodes is operated by applying the cathode pulses according to a HIPIMS method and the process gas is argon.

13. A method for applying a layer to a body, comprising disposing the body in a vacuum chamber,
supplying a process gas into the vacuum chamber,
generating a plasma in the vacuum chamber by operating at least one cathode by applying a cathode voltage with cathode pulses and sputtering a target,
applying a bias voltage to the body so that charge carriers of the plasma are accelerated towards the body and attached to its surface during a coating duration,
wherein a time course of the bias voltage comprises bias pulses during at least a part of the coating duration, wherein the bias pulses are synchronized with the cathode pulses,
and wherein the time course of the bias voltage varies during the coating duration achieving a varying timing of the bias pulses relative to the cathode pulses over the coating duration by a change of a duration of the bias pulses and/or of a phase relation of the bias pulses with respect to the cathode pulses.

14. A device for applying a layer to a body, comprising
a vacuum chamber with a carrier for the body, a process gas supply, and at least one cathode with a target,
a pulsed cathode power supply for supplying the at least one cathode with an electrical cathode voltage with cathode pulses during a coating duration,
a controllable bias power supply for applying a bias voltage to the body
and a programmable controller for controlling the bias power supply, the programmable controller including a stored coating program, wherein, when executed, the coating program causes the programmable controller to control the bias power supply so that a time course of the bias voltage comprises bias pulses during at least a part of the coating duration, the bias pulses being synchronized with the cathode pulses such that they have a defined phase relation to the cathode pulses, and wherein the coating program further provides controlling the bias power supply such that the time course of the bias voltage varies during the coating duration by a change of a duration and/or phase relation of the bias pulses over a plurality of the cathode pulses.

* * * * *